US009646906B2

(12) United States Patent
Cook et al.

(10) Patent No.: US 9,646,906 B2
(45) Date of Patent: May 9, 2017

(54) SEMICONDUCTOR PACKAGE WITH PRINTED SENSOR

(71) Applicant: Texas Instruments Incorporated, Dallas, TX (US)

(72) Inventors: Benjamin Stassen Cook, Dallas, TX (US); Juan Alejandro Herbsommer, Allen, TX (US); Django Trombley, Dallas, TX (US); Steven Alfred Kummerl, Carrolton, TX (US); Paul Emerson, Murphy, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/849,026

(22) Filed: Sep. 9, 2015

(65) Prior Publication Data
US 2016/0093548 A1    Mar. 31, 2016

Related U.S. Application Data

(60) Provisional application No. 62/056,020, filed on Sep. 26, 2014.

(51) Int. Cl.
*H01L 21/288* (2006.01)
*H01L 23/00* (2006.01)
(Continued)

(52) U.S. Cl.
CPC ........ *H01L 23/3121* (2013.01); *H01L 21/288* (2013.01); *H01L 24/09* (2013.01);
(Continued)

(58) Field of Classification Search
CPC . H01L 23/3121; H01L 23/5227; H01L 24/09; H01L 2924/46; H01L 2924/146
See application file for complete search history.

(56) References Cited

U.S. PATENT DOCUMENTS 5,220,489 A * 6/1993 Barreto ............... H01L 23/3121
174/260
6,506,438 B2 * 1/2003 Duthaler ............... B41J 3/4076
427/146
(Continued)

OTHER PUBLICATIONS

Notification of Transmittal of the International Search Report and the Written Opinion of the International Searching Authority, or the Declaration mail date: Dec. 29, 2015.

*Primary Examiner* — Peniel M Gumedzoe
(74) *Attorney, Agent, or Firm* — Jacqueline J. Garner; Charles A. Brill; Frank D. Cimino

(57) ABSTRACT

A method forming packaged semiconductor devices includes providing a completed semiconductor package having a die with bond pads coupled to package pins. Sensor precursors including an ink and a liquid carrier are additively printed directly on the die or package to provide precursors for electrodes and a sensing material between the sensor electrodes. Sintering or curing removes the liquid carrier such that an ink residue remains to provide the sensor electrodes and sensing material. The sensor electrodes electrically coupled to the pins or bond pads or the die includes a wireless coupling structure coupled to the bond pads and the method includes additively printing an ink then sintering or curing to form a complementary wireless coupling structure on the completed semiconductor package coupled to the sensor electrodes so that sensing signals sensed by the sensor are wirelessly transmitted to the bond pads after being received by the wireless coupling structure.

14 Claims, 7 Drawing Sheets

(51) Int. Cl.
*H01L 23/31* (2006.01)
*H01L 23/522* (2006.01)
*H05K 1/09* (2006.01)
*H05K 1/16* (2006.01)
*H01L 23/495* (2006.01)

(52) U.S. Cl.
CPC ............ *H05K 1/092* (2013.01); *H05K 1/162* (2013.01); *H05K 1/165* (2013.01); *H01L 23/3107* (2013.01); *H01L 23/495* (2013.01); *H01L 23/5227* (2013.01); *H01L 2224/08268* (2013.01); *H01L 2224/32245* (2013.01); *H01L 2224/48247* (2013.01); *H01L 2924/13055* (2013.01); *H01L 2924/146* (2013.01); *H05K 2201/0179* (2013.01); *H05K 2201/0999* (2013.01); *H05K 2201/10151* (2013.01)

(56) References Cited

U.S. PATENT DOCUMENTS

| | | | |
|---|---|---|---|
| 7,824,963 B2 | 11/2010 | Walberg et al. | |
| 9,164,052 B1* | 10/2015 | Speer | G01N 27/22 |
| 2006/0038129 A1* | 2/2006 | Watanabe | G01J 5/12 |
| | | | 250/338.1 |
| 2010/0052087 A1 | 3/2010 | McElrea et al. | |
| 2012/0061851 A1 | 3/2012 | Rathburn | |
| 2012/0256280 A1* | 10/2012 | Erhart | H01L 21/561 |
| | | | 257/414 |
| 2014/0124939 A1 | 5/2014 | Romig et al. | |

* cited by examiner

SEMICONDUCTOR PACKAGE WITH PRINTED SENSOR

CROSS REFERENCE TO RELATED APPLICATIONS

This application claims the benefit of Provisional Application Ser. No. 62/056,020 entitled "Method of implementing printed sensors in semiconductor packaging", filed Sep. 26, 2014, which is herein incorporated by reference in its entirety.

FIELD

Disclosed embodiments relate to packaged semiconductor devices having sensors.

BACKGROUND

The implementation of packaged semiconductor devices with sensors, especially those which require environmental exposure such as humidity, light, gas, and pressure, currently utilize one of two known sensor integration methods. The first is custom packaging which exposes the silicon (or other integrated circuit (IC) substrate) to the environment. The second is separate circuit board-level integration of the packaged IC with a packaged sensor device.

The first method currently used implements the sensor on-chip during the wafer fabrication process by forming a capacitive sensor on the die. While this is a low-cost and fully integrated solution, special packaging is required to expose the on-chip sensor to the environment. These custom packages are significantly more expensive than traditional packages, and they expose the entire IC chip's top surface to environmental conditions. Such chip exposure can cause problems such as humidity trapping, and compliance failures.

The second method separates the analog front end (AFE) of the IC that processes the sensing signal and the packaged sensor. This method requires both of these separate components to be interfaced at the circuit board level on a printed circuit board (PCB) which is not an integrated solution, and thus raises the cost.

SUMMARY

This Summary is provided to introduce a brief selection of disclosed concepts in a simplified form that are further described below in the Detailed Description including the drawings provided. This Summary is not intended to limit the claimed subject matter's scope.

Disclosed embodiments include fully-integrated additively fabricated sensors that are sensitive to at least one environmental stimulus or a user' interactive stimulus (e.g., touch) on semiconductor packages which can be obtained without (conventional) modifying the package to provide a custom package or utilizing a separate packaged sensor on a printed circuit board. One embodiment utilizes ink-based additively fabricating the sensor on the outside of a completed packaged semiconductor device, and another embodiment ink-based additively fabricates the sensor on an integrated circuit die (die) that has a pair of bond pads exposed by the packaged device after the final packaging step is completed. There are several disclosed method variants for coupling the sensor to the input/output (I/O) pins (contact pads, or terminals) of the package which are coupled to the bond pads on the die.

As used herein an "ink" includes a material that is either solid (e.g., particles, such as nanoparticles) or a precursor for a solid that forms a solid (e.g., particles) upon curing (in the case of polymers) or sintering (for inks including particles) to remove a liquid carrier which includes a solvent and/or a dispersant. For example, the ink can be a sinterable metal ink or in the case of a polymer precursor the ink can be an ultraviolet (UV)-curable polymer or a UV-curable polymer-based mixture. The ink is additively depositable by an ink printer apparatus. The ink printing apparatus can comprise an inkjet printer that uses piezoelectric, thermal, or acoustic or electrostatics, an aerosol jet, stencil, micro-deposition printer, or a screen or flexographic printer.

BRIEF DESCRIPTION OF THE DRAWINGS

Reference will now be made to the accompanying drawings, which are not necessarily drawn to scale, wherein.

DETAILED DESCRIPTION

Figure 1:
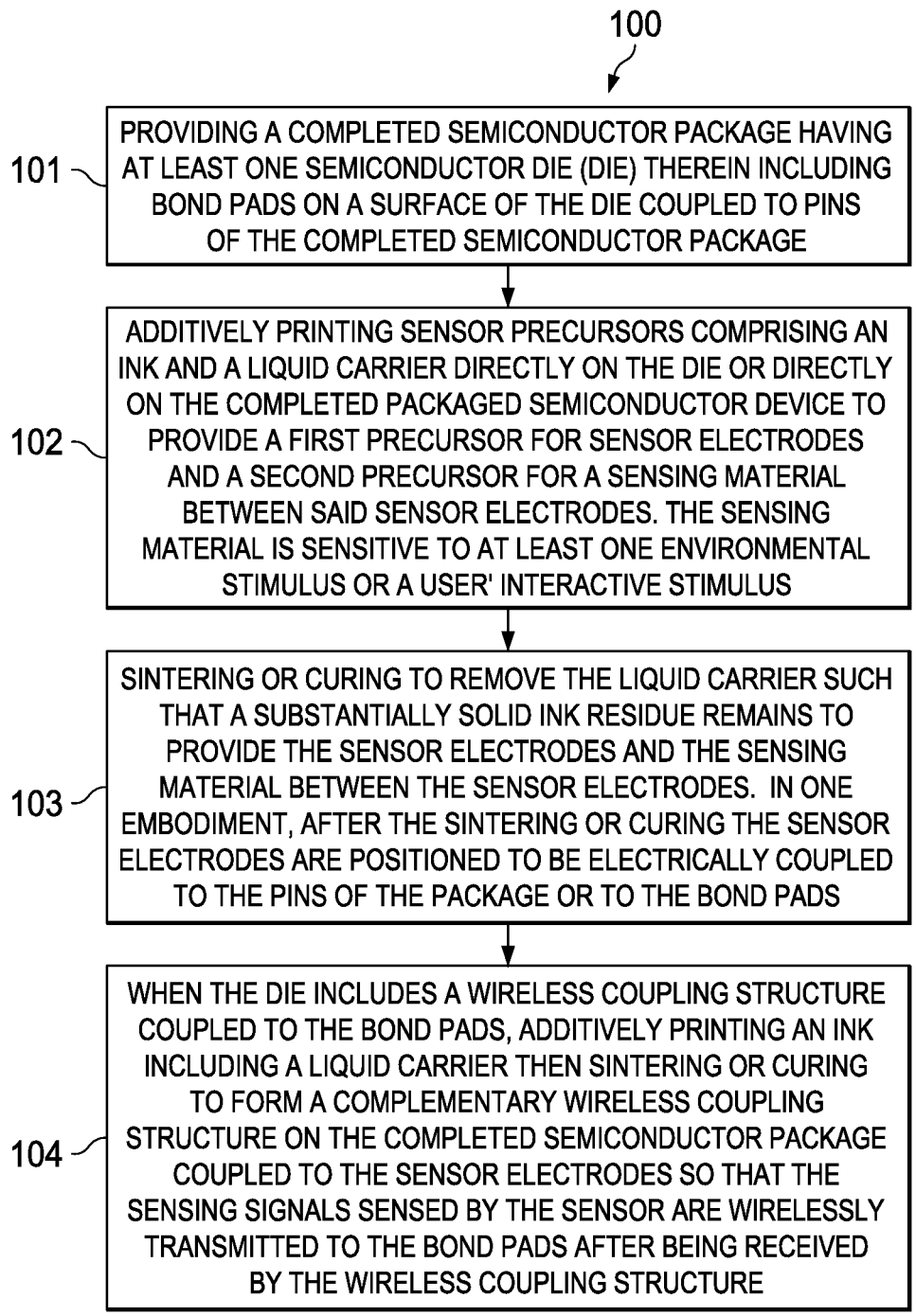
FIG. 1 is a flow chart that shows steps in an example method of forming packaged semiconductor devices with a printed sensor added to a completed semiconductor package, according to an example embodiment.

Example embodiments are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this disclosure.

FIG. 1 is a flow chart that shows steps in an example method 100 of forming packaged semiconductor devices with a printed sensor added to a completed packaged semiconductor device, according to an example embodiment. Step 101 comprises providing a completed packaged semiconductor device having at least one semiconductor die (die) therein including bond pads on a surface of the die coupled to pins (leads, terminals or contact pads) of the completed packaged device. The semiconductor package can comprise essentially any structure one can mount a semiconductor die on, including a leadframe or a package substrate comprising a ceramic, a ball grid array (BGA) a pin grid array (PGA), a printed circuit board (PCB), an organic substrate, flexible plastic substrate, or a paper-based substrate.

Step 102 comprises additively printing sensor precursors comprising an ink and a liquid precursor directly on the die or directly on the completed packaged semiconductor device to provide a first precursor for sensor electrodes and second precursor for a sensing material between the sensor electrodes. The sensing material is sensitive (i.e., provides a change in an electrical response) responsive to at least one environmental stimulus or a user's interactive stimulus such as pressure from a touch or other user' stimulus. The environmental stimulus can be temperature, pressure, vibration (e.g., sound), humidity, light, or a gas or class of gases (e.g., reducing gases such as $H_2$). As described above the ink printing apparatus can comprise an inkjet printer that uses piezoelectric, thermal, or acoustic or electrostatics, an aerosol jet, stencil, micro-deposition printer, or a screen or flexographic printer.

Step 103 comprises sintering or curing to remove the liquid carrier such that a substantially solid ink residue remains to provide at least one sensor comprising the sensor electrodes and the sensing material between the sensor electrodes. In the case of a metal ink including metal nanoparticles, the sintering can take place at a temperature typically between 60° C. and 200°. However, the sintering or curing temperature may be limited to 60° C. to 100° C. in the case of a plastic or other low heat tolerance package substrate material.

The resulting ink residue films or islands have a microstructure which significantly differs and is morphologically distinct from films formed from conventional metal deposition techniques (e.g., low pressure chemical vapor deposition (LPCVD) or sputtering). As used herein, an ink residue has a high relative porosity and associated specific surface area, typically having at least a portion that has a portion that has a porosity between 10% and 80%, typically being 20 to 60%. The porosity may not be uniform along the thickness of the ink residue, with the highest porosity generally being towards the top of the residue.

After the sintering or curing the sensor electrodes are positioned to be electrically coupled to the pins (pads, or terminals) of the package or to be coupled to the bond pads, or the die includes a wireless coupling structure coupled to the bond pads and the method further comprises step 104. Step 104 comprises additively printing an ink including a liquid carrier then sintering or curing to form a complementary wireless coupling structure on the completed packaged semiconductor device coupled to the sensor electrodes so that the sensing signals sensed by the sensor are wirelessly transmitted to the bond pads after being received by the wireless coupling structure. Again, the sintering or curing temperature may be limited to 60° C. to 100° C. in the case of plastic or other low heat tolerance package substrate material.

Metallic nanoinks used for a disclosed inkjet printing process for printing disclosed electrodes can be selected from any of a number of commercially available or customized nanoinks. One example of a commercial provider of such metallic nanoinks is Cima NanoTech of St. Paul, Minn. In various embodiments, such nanoinks can have nanosize copper, silver, palladium, platinum and/or gold particles mixed into a water-based or other liquid-based formulation to be printed onto the surface to create either a rough topology on the surface, or a different metal chemistry at the surface. The overall nanoink composition may range from 20% to 100% metallic particle loading by weight, although other composition percentages can also be used. Metal particles in a useful nanoink can range in size from a diameter of about 5 nms to 100 nms, although smaller or larger particle sizes can also be used. Other types of metals may also be used, although the metals listed above generally work well.

The inks for forming the sensor film can comprise at least one non-metal sensor material. For example, printable polymer-based inks for printing sensing materials can include Poly(3,4-ethylenedioxythiophene) (PEDOT: polystyrene sulfonate (PSS), PolyPyrrole (PPy), Polythiophene (pTh), or doped polyaniline (PANI). Inks comprising at least semiconductive carbon nanomaterial including carbon nanotubes (CNT) or graphene can also be used for forming sensor films. Doping profiles allow for selectivity and sensitivity improvement, polymer matrices, metal oxides, metallic and carbon nanostructures.

Gases in the low part per million (PPM) to high part per billion (PPB) range can generally be sensed, such as for sensing ammonia ($NH_3$) in one particular embodiment. Typical response times can be in the range from 0.1 seconds to 10 seconds. Both the real part (R) and imaginary part (jX) of the impedance (Z) of the sensor film can change upon exposure to the target gas, with a change (typically an increase) in Z upon exposure to the target gas, $\Delta Z$, up to about 1,000% (3 orders of magnitude).

The inkjet printer can be selected from any of a number of commercially available or customized inkjet printers. Alternatively, a customized inkjet printer can be designed to work for the specific nanoink. One example of such a customized inkjet printer can be one specifically designed for manufacture by Dimatix, Inc. of Santa Clara, Calif. In further embodiments, a series of inkjet printers can be used, such as where several different distinct nanoinks are to be printed. Such different nanoinks may comprise different metals, may be printed in interactive patterns or layouts, and/or may be printed atop one other, such as after a sinter process for each one.

Figure 2A:
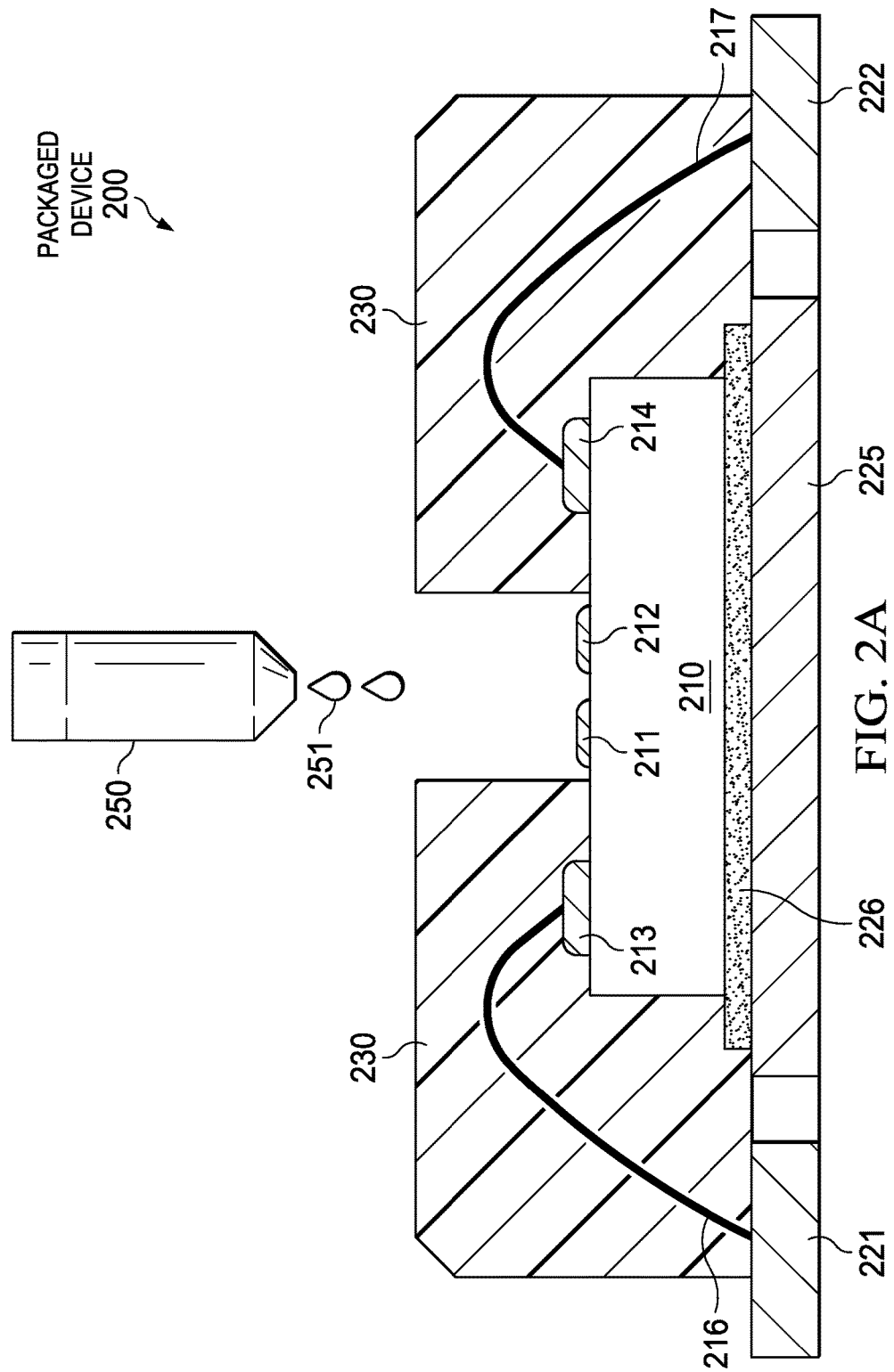
FIG. 2A depicts a cross section view showing the use of an inkjet printer or similar additive ink deposition system to print a sensor including a sensor material and sensing electrodes, with the sensing electrodes placed directly on exposed bond pads on the surface of the die that is otherwise within a completed semiconductor package, according to an example embodiment.

One example method is depicted in the cross section view of FIG. 2A which uses an inkjet printer or similar additive ink deposition system (e.g., a screen or flexographic printer) to print an ink to enable forming a sensor including a sensor material as well as sensing electrodes directly on the surface of a die (or a die on top of a die stack) that is exposed by a completed packaged semiconductor device that is otherwise not exposed. As described above the additive printing of the sensor is enabled by conformal additive printing techniques such as provided by an inkjet printer that uses piezoelectric, thermal, or acoustic or electrostatics, an aerosol jet, stencil, micro-deposition printer, or a screen or flexographic printer. The sensor can be any suitable thin film sensor or other structure such as a stacked set of films, pillars, or an ionic fluid, that allows for an electrical change in the film's properties responsive to exposure to an environmental stimulus or a user' interactive stimulus such as touch.

FIG. 2A shows a cross section view showing the use of an inkjet printer or similar additive ink deposition system 250 dispensing ink droplets 251 for printing an ink that after sintering or curing forms a sensor including a sensor material and sensing electrodes with the sensing electrodes directly on bond pads 211 and 212 on the surface of the die 210 of packaged device 200. The packaged device 200 shown has a partially exposed top surface of the die 210 that has plastic encapsulant (mold) 230 configured to expose only a few of the plurality of bond pads on the die 210 to the outside world, with the exposed bond pads shown as bond pads 211 and 212. Bond pads 213 and 214 are shown wirebonded by bond wires 216 and 217 to leads 221 and 222 of the package in a molded portion of the packaged device 200. The die 210 is mounted on a die pad 225 by a die attach material 226 such as comprising an epoxy. After sintering or curing the ink another molding step can be used to form mold over the bond pads 211 and 212 and the sensing material between the bond pads 211 and 212 so that the sensor can be encapsulated within the final packaged device.

The sensor is formed having 2 electrically isolated sensing electrodes as well as a sensing material between the sensing electrodes, where the sensing material is generally not the same material as the electrode material. There are at least two ink depositions to form the respective electrodes and the sensor material, such as the three ink depositions, (electrode deposition, sensor deposition, electrode deposition) as shown in the FIG. 2B described below. The sensing electrodes contact across the sensing material, and for the packaged device 200 in FIG. 2A the respective sensing electrodes are deposited over bond pads 211 and 212 on the top surface of the die 210.

A few example implementations comprise:
1. First and second electrodes are deposited during a first ink deposition (e.g., planar capacitor/resistor), and a sensor film is deposited during a second ink deposition.
2. A bottom electrode is deposited during a first ink deposition, a sensor film deposited during a second ink deposition, and a top electrode is deposited during a third ink deposition. (see FIG. 2B described below)
3. First and second electrodes deposited during a first ink deposition, a sensor film is deposited during a second ink deposition, and a gate dielectric layer is deposited during a third ink deposition then a gate electrode is deposited (e.g., using a further ink deposition) on the gate dielectric layer to form a thin-film transistor (TFT).

The sensing electrodes are typically connected to bondpads on the die such as for packaged device 200 shown in FIG. 2A, except in disclosed embodiments where the sensing electrodes are wirelessly coupled to the bond pads through a wireless (e.g., RF) coupling structure. Example wireless coupling structures include an antenna (a wire antenna such as a dipole antenna, an aperture antenna such as a slot, and a microstrip antenna such as a patch), an inductor (resonant loop), and a near-field coupling structure such as a fringing field capacitor.

Figure 2B:
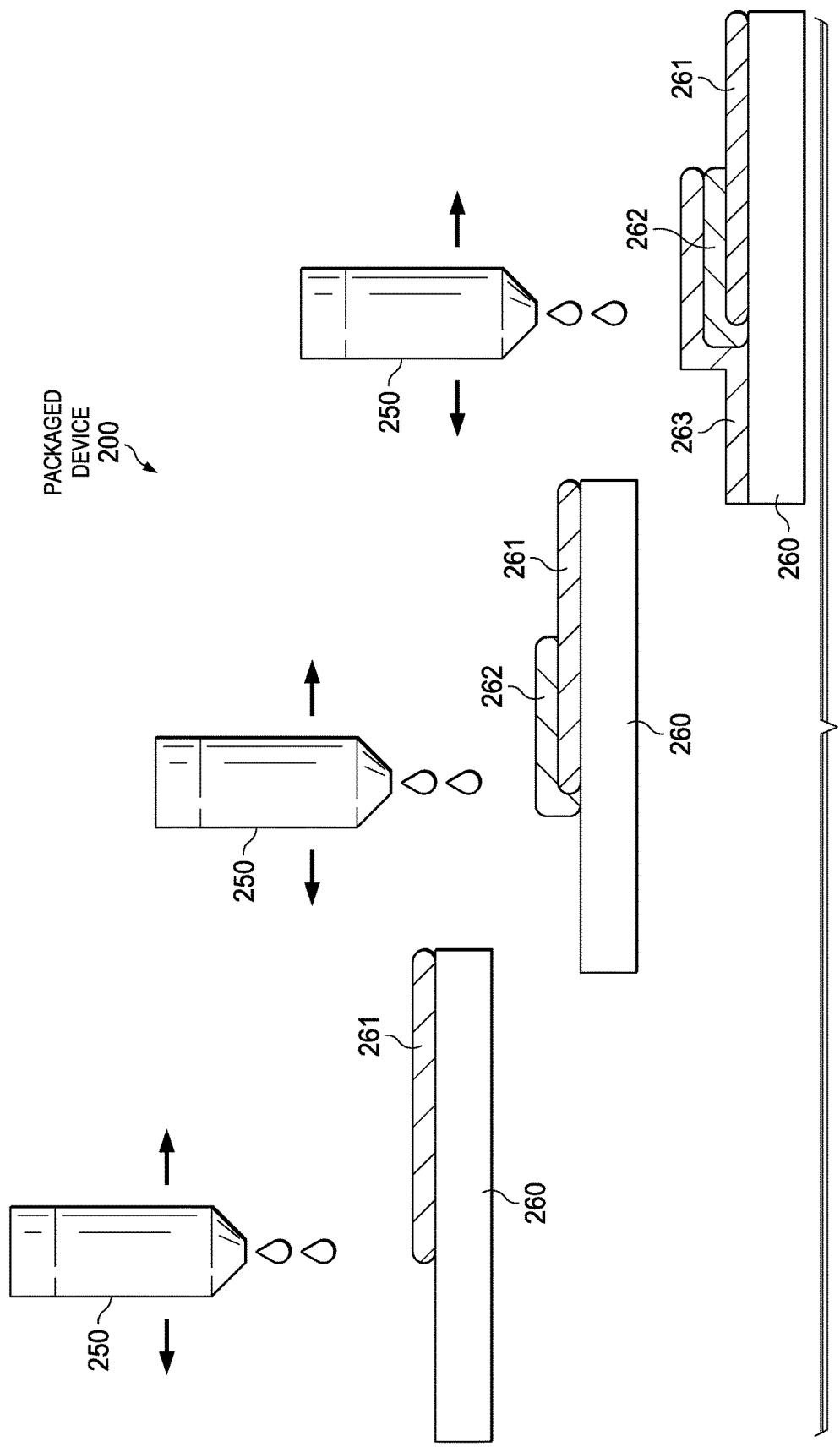
FIG. 2B depicts three additive depositions to form a disclosed sensor including a bottom electrode deposition, a sensor material deposition, and a top electrode deposition, according to an example embodiment.

FIG. 2B depicts three additive depositions of ink to form a sensor on a substrate 260 including a deposition for forming a bottom electrode, a deposition for forming a sensor material, then a deposition for forming a top electrode, according to an example embodiment. The leftmost depiction additively deposits an ink for forming a bottom electrode 261. The center depiction additively deposits an ink for forming a sensor material 262 including over the bottom electrode 261. The rightmost depiction additively deposits an ink for forming a top electrode 263 including over the sensor material 262. The top electrode 263 (as well as bottom electrode 261) can be a porous electrode to permit the sensor material to be exposed to an environmental stimulus, which is conveniently provided by disclosed ink residues, which as described above typically have at least 10%, typically being 20% to 60% porosity. As described above, the substrate 260 can comprise essentially any structure one can mount a semiconductor die on, including a leadframe, or a package substrate comprising a ceramic, a BGA a PGA, a PCB, an organic substrate, flexible plastic substrate, or a paper-based substrate.

Figure 2C:
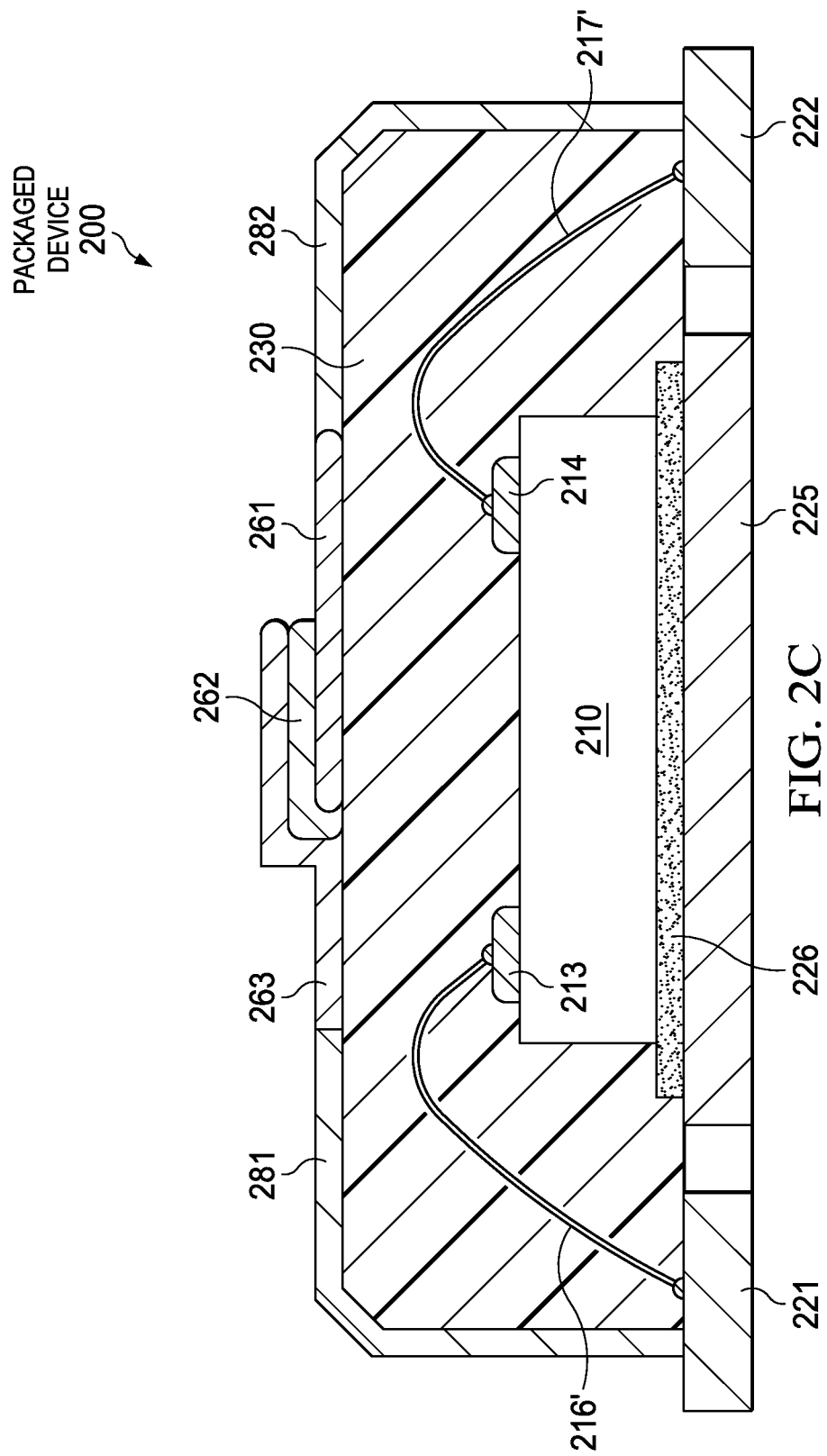
FIG. 2C depicts a cross section view showing the result from using an inkjet printer or similar additive ink deposition system to print a sensor material on the outer mold surface of a completed semiconductor package, where the sensing electrodes are for contacting contact pads on the top of the package that are connected to the pins of the package, according to an example embodiment.

FIG. 2C is a cross section view showing the result from using an inkjet printer or similar additive ink deposition system to print a sensor 261/262/263 including a sensor material 262 on the outer surface of the mold 230 of a completed semiconductor packaged device to provide packaged device 200. The respective sensing electrodes 261, 263 contact across the sensor material 262, and also contact the leads 222 and 221 of the packaged device 200, respectively. Sidewall connectors 281, 282 establish a connection along the surface of the mold 230 between top electrode 263 and lead 221 (which is coupled to bond pad 213 by bond wire 216') and bottom electrode 261 and lead 222 (which is coupled to bond pad 214 by bond wire 217'). It is noted that the sidewall connectors 281 and 282 may be printed or provided otherwise (e.g., by a sputter process) before printing the sensor 261/262/263.

Figure 3A:
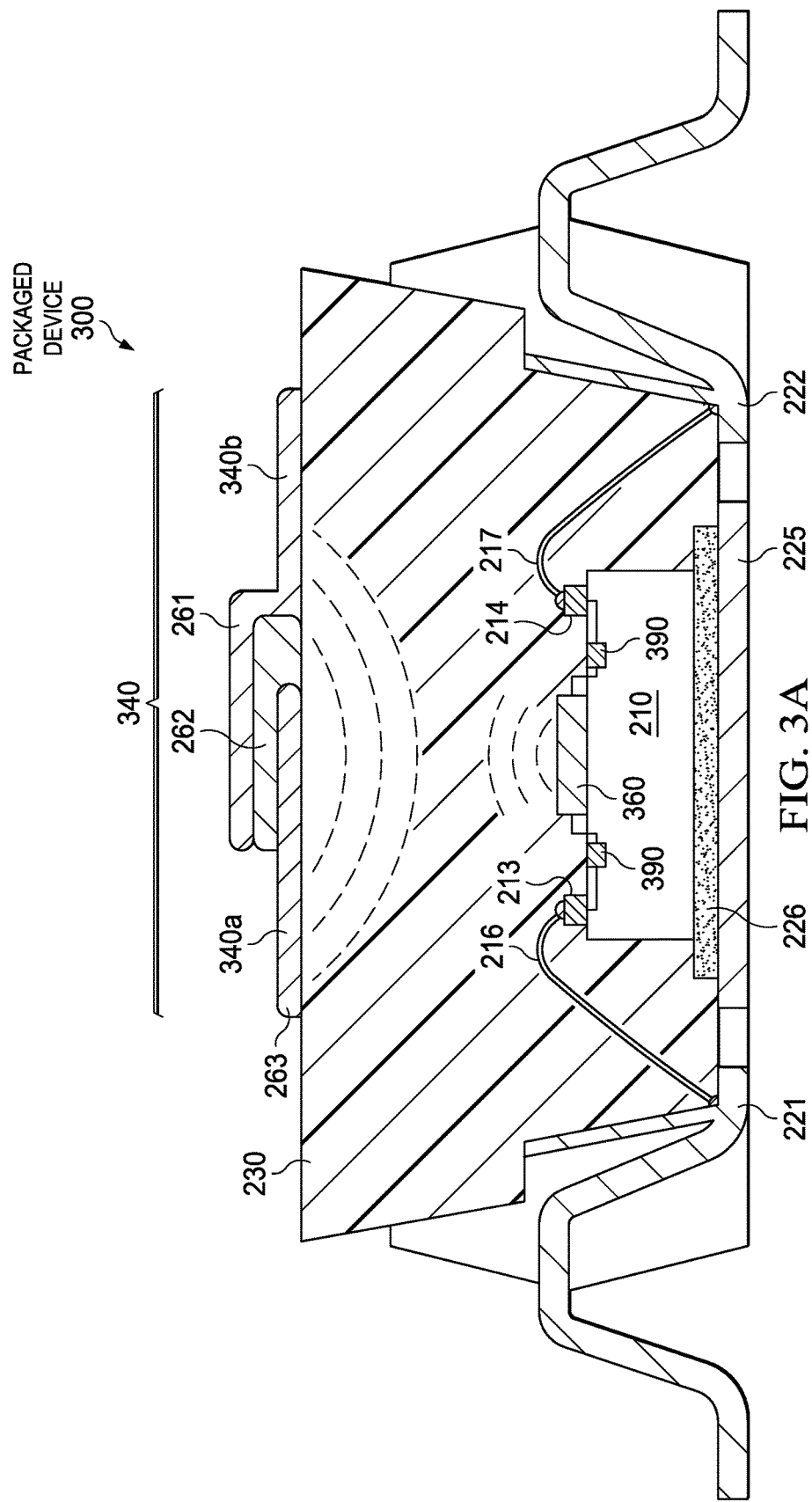
FIG. 3A shows a cross section view of an example packaged device including an ink-based additive sensing device with a dipole antenna and FIG. 3B shows a top perspective view of a packaged device including a sensing device with a resonant inductive loop antenna, where the die has a wireless coupling structure, and where during device operation energy is wirelessly coupled from the antenna coupled to the sensing device to the wireless coupling structure on die so that the sensed properties are extracted, according to an example embodiment.
Figure 3B:
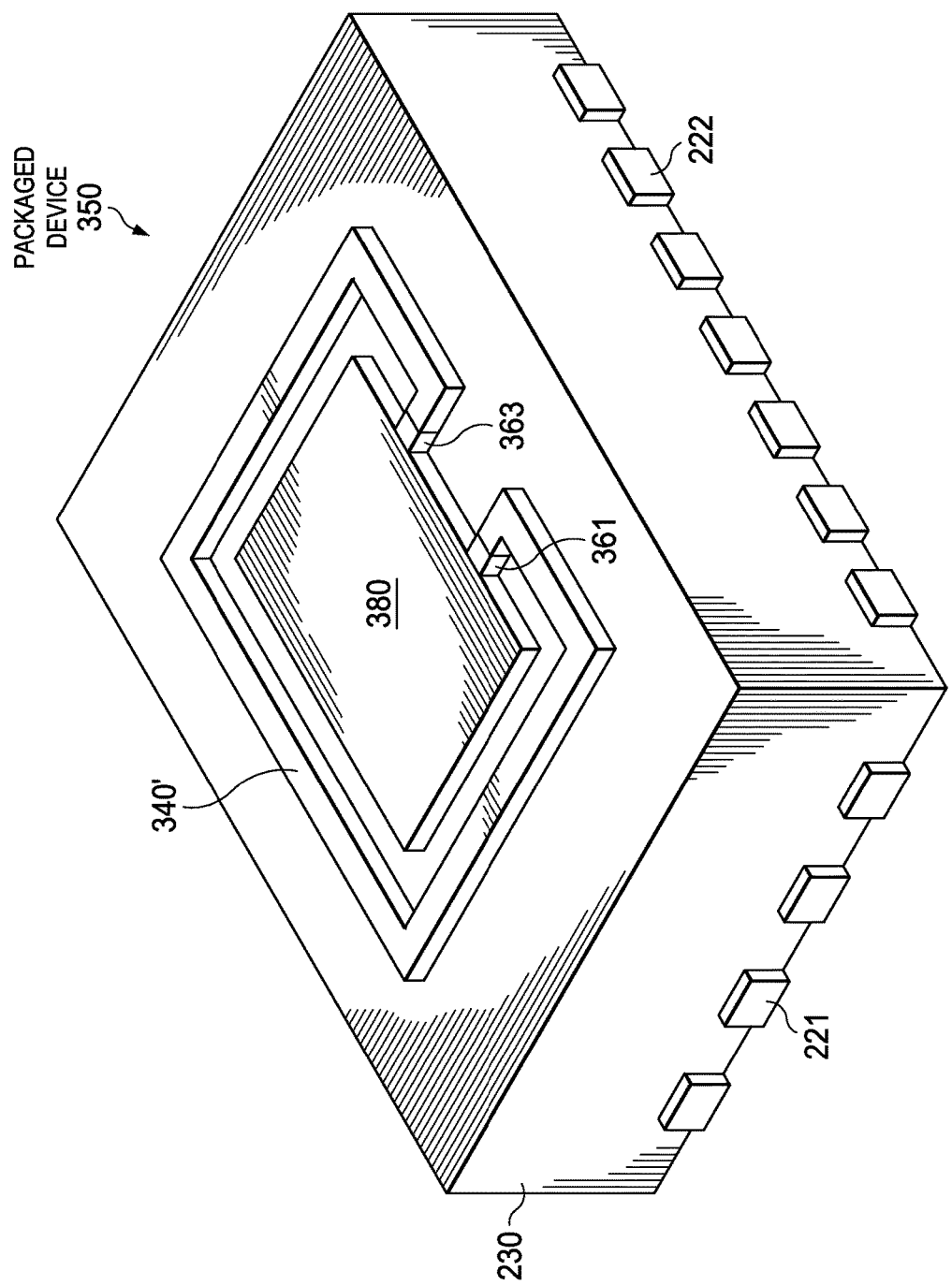

Another disclosed method with a resulting packaged device with a wireless sensor comprising a sensor coupled to a wirelessly coupling structure is depicted in FIG. 3A (cross section view of a packaged device 300 including a sensing device with a dipole antenna) and FIG. 3B (top perspective view of a packaged device 350 with a sensing device with a resonant inductive loop antenna). This method involves additively printing a sensor 263/262/261 and a wirelessly coupling structure stacked on one another or on the side of one another. In FIG. 3A electrode 263 extends out laterally from the sensor to provide one pole 340a of the dipole antenna 340, and electrode 261 extends out laterally in the opposite direction from the sensor to provide the other pole 340b of the dipole antenna 340.

A wireless coupling structure 360 is also shown fabricated on the die 210, in this case another dipole antenna is formed on the top surface of the die 210. No power is needed to be supplied for the wireless interrogation of the sensor 263/262/261 since the sensor can be read by electronics 390 coupled to dipole antenna 360 wirelessly in a passive fashion. By coupling the energy from the dipole antenna 340 to the dipole antenna of the wireless coupling structure 360 on the die 210, the sensor signal output by the sensor 263/262/261 can be wirelessly transmitted to the electronics 390 on the die 210 to be read out from leads 221 and 222. Wireless measurement of the sensor 263/262/261 can be performed by a variety of other methods besides that shown in FIG. 3A by including appropriate structures on the die 210 and on the outside of the packaged device 300. For example, by measuring the mutual impedance of the coupling structure on the die 210 and the top of the packaged device, or by time domain reflectometry.

Packaged device 350 shown in FIG. 3B includes a sensor 360 formed on the on outer surface of the mold 230 of the package device 350. The resonant inductive loop antenna shown as 340' has one end coupled to a first electrode 361 of the sensor 380 and its other end coupled to the second electrode 363 of the sensor 380. First electrode 361 can be a top or bottom electrode and second electrode 363 can be the other of a top and bottom electrode. The die within the package includes a resonant inductive loop antenna. Although not shown, first electrode 361 and second electrode 363 can be interdigitated electrodes having fingers interdigitated with one another, with each electrode including and end contact pad. In the case of interdigitated electrodes, a sensing film can be printed over the finger regions, where the contact pads to each electrode are exposed (no sensor film thereon) to allow electrical contact to the contact pads.

Figure 4:
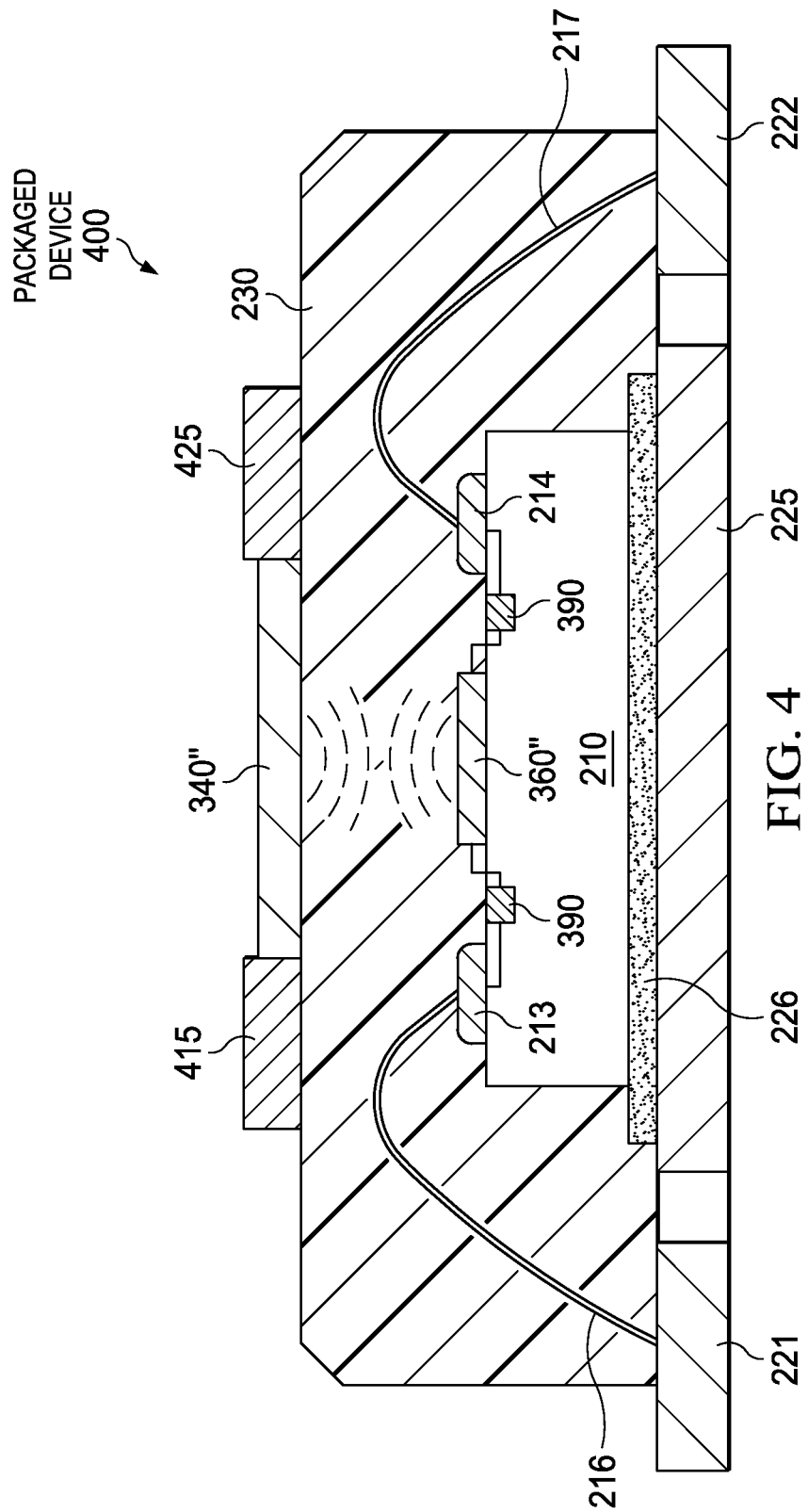
FIG. 4 depicts a cross section view showing an example packaged semiconductor device where the die has a wireless coupling structure resulting from using an inkjet printer or similar additive ink deposition system to print first and second sensors having different sensor materials that share a complementary wireless coupling structure formed on the outer surface of a completed semiconductor package, where during device operation energy is wirelessly coupled from the complementary wireless coupling structure to the wireless coupling structure on the die so that the sensed properties are extracted, according to an example embodiment.

Arrays of different sensors (e.g., humidity and temperature) can be printed on disclosed packaged devices. FIG. 4 depicts a cross section view showing an example packaged device 400 resulting from using an inkjet printer or similar additive ink deposition system to print a first sensor 415 and second sensor 425 having different sensor materials both utilizing a shared complementary wireless coupling structure 340" on the outer surface of the mold 230 of a completed semiconductor package, according to an example embodiment. The die 210 also has a wireless coupling structure 360". As described above the wireless coupling structures can comprise a wire antenna, an aperture antenna, a microstrip antenna, an inductor, or a near-field coupling structure.

During operation of the packaged device 400 energy is wirelessly coupled from the complementary wireless coupling structure 340" to the wireless coupling structure 360" on the die 210. This enables the properties sensed by sensors 415 and 425 to be extracted for sensor data processing by electronics on the die 210.

Various communication methods can be used to support a packaged device 400 having different wireless sensors. In some example embodiments, different resonant frequency coupling structures, time diverse responses similar to those known for time domain, radio-frequency identification (RFID) or surface acoustic wave (SAW) RFID can be integrated on the packaged device 400 as long as the wireless coupling structures 340 and 360 include a suitable structure for sharing the wireless link, such as for generating frequency or time diverse signals. The shared wireless link can utilize Frequency Division Multiplexing (FDM), Wave Division Multiplexing (WDM), or Time Division Multiplexing (TDM). FDM and WDM are analog techniques, whereas TDM is a digital technique.

Advantages of disclosed semiconductor packages with printed sensors include:
1. Allows the sensor to have full or controlled environmental exposure.
2. Ability to process multiple types of sensors onto the same package for a diversity of sensors using the same chip.
3. Low-cost.
4. Allows for non-CMOS compatible materials to be deposited.
5. Reduction of board mount sensor parasitics which differ when board implementation changes at the customer level For embodiments besides the special package used by packaged device 200 described relative to FIG. 2A, other advantages include 6. Full encapsulation of the die and protection from environmental conditions, and 7. A reduction in cost for custom packaging be being able to use standard packages.

Moreover, as described above, disclosed methods being enabled by recent advances in additive technologies such as inkjet and aerosol jet printing allow for the conformal printing of ink materials in a layer-by-layer manner on top of nearly any surface. This means that a wide variety of packaging schemes can utilize this technique with little or no modification.

Disclosed embodiments can be integrated into a variety of assembly flows to form a variety of different packaged semiconductor integrated circuit (IC) devices and related products. The assembly can comprise single semiconductor die or multiple semiconductor die, such as PoP configurations comprising a plurality of stacked semiconductor die. A variety of package substrates may be used. The semiconductor die may include various elements therein and/or layers thereon, including barrier layers, dielectric layers, device structures, active elements and passive elements including source regions, drain regions, bit lines, bases, emitters, collectors, conductive lines, conductive vias, etc. Moreover, the semiconductor die can be formed from a variety of processes including bipolar, insulated-gate bipolar transistor (IGBT), CMOS, BiCMOS and MEMS.

Those skilled in the art to which this disclosure relates will appreciate that many other embodiments and variations of embodiments are possible within the scope of the claimed invention, and further additions, deletions, substitutions and modifications may be made to the described embodiments without departing from the scope of this disclosure.

The invention claimed is:

1. A packaged semiconductor device with at least one printed sensor, comprising:
   a semiconductor package having at least one semiconductor die (die) therein including bond pads on a surface of said die coupled to pins of said semiconductor package; and
   said a printed sensor (sensor) comprising sensor electrodes and a sensing material comprising an ink residue between said sensor electrodes directly on said semiconductor package, said sensing material being sensitive to at least one environmental stimulus or a user' interactive stimulus;
   wherein said die includes a wireless coupling structure coupled to said bond pads and there is a complementary wireless coupling structure on said packaged semiconductor device coupled to said sensor electrodes so that sensing signals sensed by said sensor are wirelessly transmitted to said bond pads after being received by said wireless coupling structure.

2. The packaged semiconductor device of claim 1, wherein said sensor comprises a first sensor and at least a second sensor, and wherein said first and said second sensor have different ones of said sensing material.

3. The packaged semiconductor device of claim 2, wherein said first sensor and said second sensor are both coupled wirelessly to said complementary wireless coupling structure.

4. A packaged semiconductor device comprising:
   a semiconductor die attached and electrically connected to a substrate;
   a plurality of bond pads on the semiconductor die;
   a sensor including ink residue between sensor electrodes, the sensor electrodes connected to the plurality of bond pads; and
   a mold compound encapsulating portions of the substrate and the semiconductor die, the mold compound defining an opening in the packaged semiconductor device exposing the sensor.

5. The packaged semiconductor device of claim 4, wherein the semiconductor die is electrically connected to the substrate via wire bonds.

6. The packaged semiconductor device of claim 4, wherein the sensor is sensitive to one of an environmental stimulus and a user interactive stimulus.

7. The packaged semiconductor device of claim 4, wherein the ink residue has a portion with porosity between 10% and 80%.

8. The packaged semiconductor device of claim 4, wherein the sensor electrodes are electrically connected to the substrate.

9. A packaged semiconductor device comprising:
   a semiconductor die attached and electrically connected to a substrate;
   a mold compound encapsulating portions of the substrate and the semiconductor die; and
   a sensor on the mold compound, the sensor including ink residue between sensor electrodes, the sensor electrodes capable of wirelessly communicating to the semiconductor die.

10. The packaged semiconductor device of claim 9, wherein the semiconductor die includes a first wireless coupling structure coupled to a plurality of bond pads.

11. The packaged semiconductor device of claim 10 further comprising a second wireless coupling structure on the mold compound coupled to the sensor electrodes.

12. The packaged semiconductor device of claim 11, wherein the first and second wireless coupling structures include a radio frequency wireless coupling structure.

13. The packaged semiconductor device of claim 9, wherein the ink residue includes a metallic nanoink having one of a copper, palladium, platinum and gold.

14. The packaged semiconductor device of claim 9, wherein the sensor electrodes are porous sensor electrodes.

\* \* \* \* \*